United States Patent [19]
Lee et al.

[11] Patent Number: 6,103,609
[45] Date of Patent: Aug. 15, 2000

[54] METHOD FOR FABRICATING SEMICONDUCTOR DEVICE

[75] Inventors: Kee Sun Lee; Byung Hak Lee, both of Chungcheongbuk-do, Rep. of Korea

[73] Assignee: LG Semicon Co., Ltd., Chungcheongbuk-do, Rep. of Korea

[21] Appl. No.: 09/181,653

[22] Filed: Oct. 29, 1998

[30] Foreign Application Priority Data

Dec. 11, 1997 [KR] Rep. of Korea ................. 97/67897
Dec. 26, 1997 [KR] Rep. of Korea ................. 97/74379

[51] Int. Cl.⁷ ................................................ H01L 21/3205
[52] U.S. Cl. ........................................ 438/592; 438/660
[58] Field of Search .................................. 438/592, 660

[56] References Cited

U.S. PATENT DOCUMENTS

| | | |
|---|---|---|
| 5,416,045 | 5/1995 | Kauffman et al. |
| 5,604,140 | 2/1997 | Byun . |
| 5,733,816 | 3/1998 | Iyer et al. ................. 438/592 |
| 5,874,353 | 2/1999 | Lin et al. ................. 438/592 |
| 5,888,588 | 3/1999 | Nagabushnam et al. ........... 427/248.1 |
| 5,902,129 | 5/1999 | Yoshikawa et al. ............. 438/592 |
| 5,923,999 | 7/1999 | Balsubramanyam et al. ........ 438/592 |
| 5,958,508 | 9/1999 | Adetutu et al. ............... 427/248.1 |
| 5,976,962 | 11/1999 | Oda ......................... 438/592 |
| 6,022,795 | 2/2000 | Chen et al. .................. 438/586 |
| 6,027,961 | 2/2000 | Maiti et al. ................. 438/199 |
| 6,043,148 | 3/2000 | Peng et al. .................. 438/628 |

OTHER PUBLICATIONS

M.T. Takagi et al., ULSI Device Engineering Lab, IEDM 96 pp. 455–458.
Y. Akasaka et al., ULSI research Labs, 1995 ISMIC 104/95/0168, pp. 168–174.

*Primary Examiner*—Richard Booth

[57] ABSTRACT

Method for fabricating a semiconductor device, is disclosed, in which a grain size is made coarse for forming a thin film with a low resistance, including the steps of (1) depositing an insulating film on a substrate, (2) depositing a silicon layer on the insulating film, (3) depositing an amorphous metal nitride film on the silicon layer, and (4) heat treating the amorphous metal nitride film to alter into a crystalline pure metal film.

19 Claims, 5 Drawing Sheets

METHOD FOR FABRICATING SEMICONDUCTOR DEVICE

BACKGROUND OF THE INVENTION

1. Field of the Invention

The present invention relates to a semiconductor device, and more particularly, to a method for fabricating a semiconductor device, in which a grain size is made coarse for forming a thin film with a low resistance.

2. Discussion of the Related Art

As semiconductor device packing advances, widths of lines therein are in general reduced, with increased resistance that causes problems, such as slowing down a device operation speed. To solve the problem of an increased sheet resistivity, a thickness of the line may be increased while reducing a width of the line, which again causes problems of complicated fabrication process and low yield due to difficulty in gap filling in deposition of an interlayer insulating film between the lines having a greater aspect ratio, with a high possibility of void formation. In order to solve these problems, a refractory metal silicide, such as tungsten silicide Wsix, titanium silicide TiSix, or cobalt silicide CoSix or the like is formed on a polysilicon layer in a background art, for preventing increased resistivity. Even though the formation of the refractory metal silicide may improve a resistivity and a step coverage to some extent, an improved method for forming a polycide has been in need.

A background art method for fabricating a semiconductor device will be explained with reference to the attached drawings. FIGS. 1a~1c illustrate sections showing the steps of a background art method for fabricating a semiconductor device.

Referring to FIG. 1a, the background art method for fabricating a semiconductor device starts with forming a silicon oxide film $SiO_2$ 12 on a semiconductor substrate 11, for use as a gate insulating film. Then, a polysilicon layer 13, a tungsten nitride film 14, and a pure tungsten film 15 are formed on the silicon nitride film 12 in succession, for use as a gate electrode. The tungsten nitride film 14 is formed very thin, and the tungsten film 15 is reactive sputtered. The tungsten nitride film 14 is formed for preventing reaction between the tungsten film 15 and the polysilicon layer 13, that forms tungsten silicide at an interface of the tungsten film 15 and the polysilicon layer 13. The tungsten silicide at the interface of the tungsten film 15 and the polysilicon layer 13 increases a sheet resistivity. Then, a photoresist film 16 is coated on the tungsten film 15, subjected to exposure and development, to pattern the photoresist film 16 to define a gate region. As shown in FIG. 1b, the patterned photoresist film 16 is used as a mask in selectively removing the tungsten film 15, the tungsten nitride film 14, the polysilicon layer 13, and the silicon oxide film 12, to form a gate electrode 18 and a gate insulating film 12a. As shown in FIG. 1c the photoresist film 16 is removed, the gate electrode 18 is used as a mask in lightly doping the semiconductor substrate 11, and insulating sidewalls 19 are formed at both sides of the gate electrode 18. The gate electrode 18 and the insulating sidewalls 19 are used as a mask in doping the semiconductor substrate 11 heavily, to form source/drain impurity regions 17 in surfaces of the semiconductor substrate 11 on both sides of the gate electrode 18.

However, the background art method for fabricating a semiconductor device has the following problems.

First, the additional tungsten thin film formation process makes the fabrication process complicated, with a reduction of productivity.

Second, formation of an even and thin, to a few tens of Å, tungsten nitride film is difficult.

Third, the low temperature approx. 300° C. in formation of the tungsten thin film hampers formation of the tungsten thin film with coarse grains because diffusion of tungsten atoms should be accompanied for growth of crystal grains in the tungsten thin film.

SUMMARY OF THE INVENTION

Accordingly, the present invention is directed to a method for fabricating a semiconductor device that substantially obviates one or more of the problems due to limitations and disadvantages of the related art.

An object of the present invention is to provide a method for fabricating a semiconductor device, in which crystal grain is made coarse for forming a thin film with a low resistance.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a semiconductor device includes the steps of (1) depositing an insulating film on a substrate, (2) depositing a silicon layer on the insulating film, (3) depositing an amorphous metal nitride film on the silicon layer, and (4) heat treating the amorphous metal nitride film to alter into a crystalline pure metal film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings. FIGS. 2a~2d illustrate sections showing the steps of a method for fabricating a semiconductor device in accordance with a first preferred embodiment of the present invention.

Figure 1A:
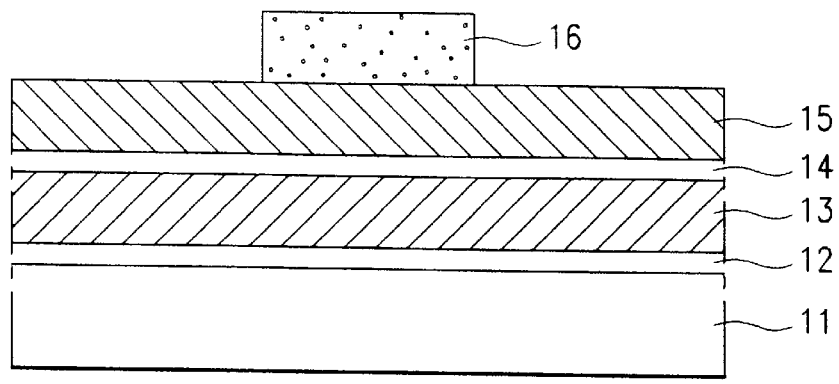
FIGS. 1a~1c illustrate sections showing the steps of a background art method for fabricating a semiconductor device.
Figure 1B:
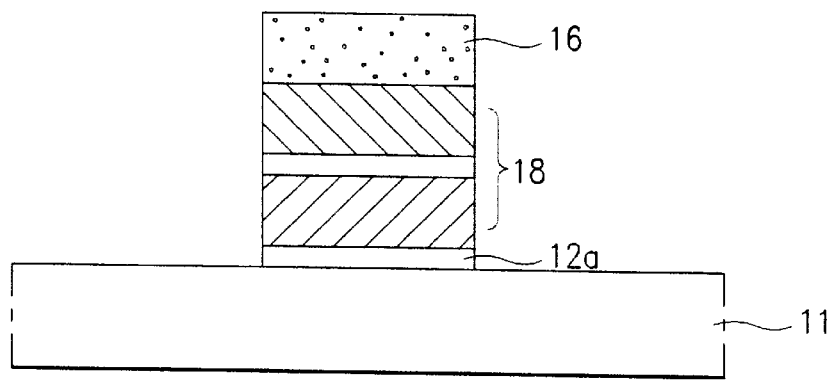
Figure 1C:
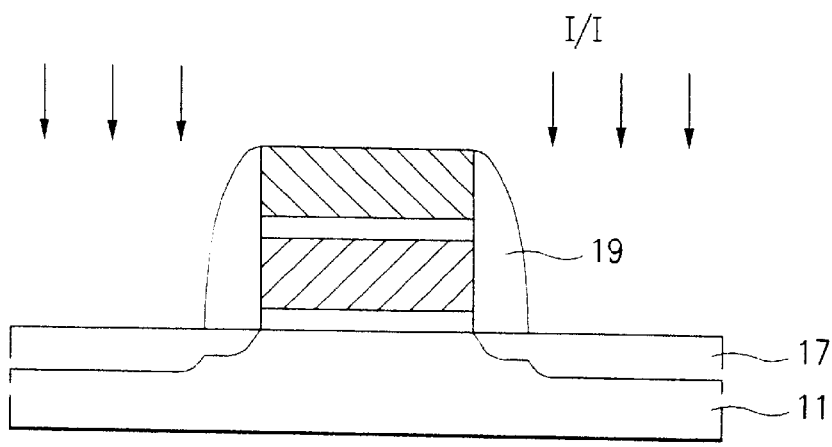
Figure 2A:
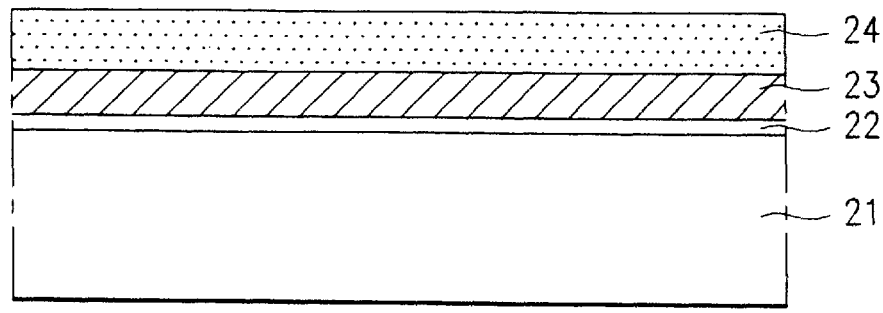
FIGS. 2a~2d illustrate sections showing the steps of a method for fabricating a semiconductor device in accordance with a first preferred embodiment of the present invention; and, FIGS. 3a~3e illustrate sections showing the steps of a method for fabricating a semiconductor device in accordance with a second preferred embodiment of the present invention.
Figure 2B:
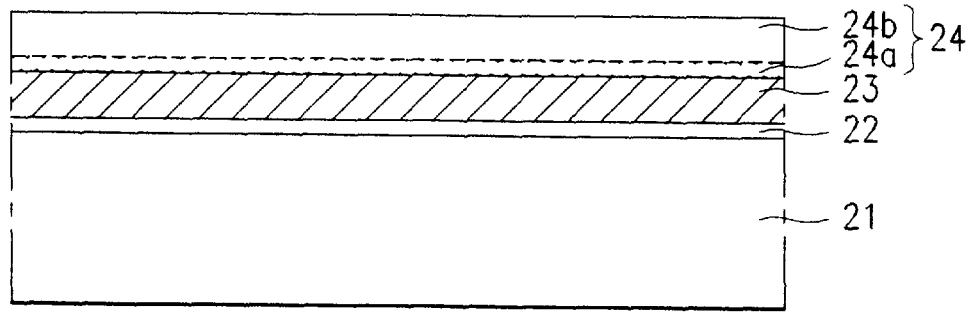
Figure 2C:
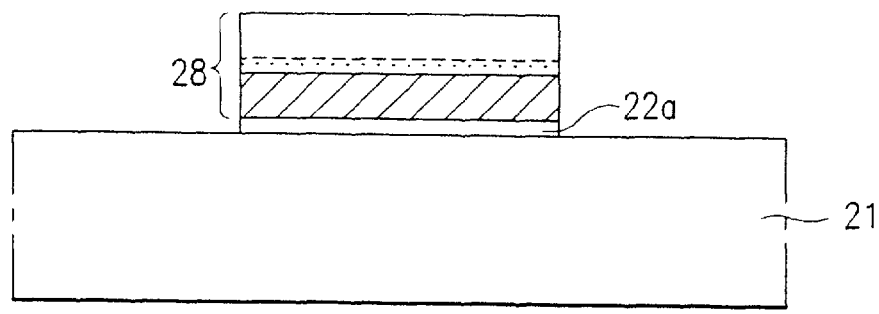
Figure 2D:
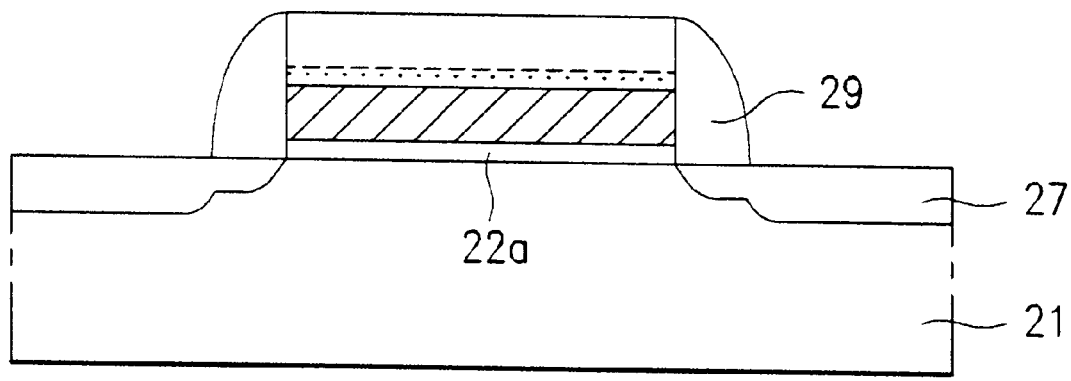

Referring to FIG. 2a, the steps of the method for fabricating a semiconductor device in accordance with a first preferred embodiment of the present invention starts with deposition of a silicon oxide $SiO_2$ film 22 on a semiconductor substrate 21 to a thickness of approx. 65 Å by chemical vapor deposition or thermal oxidation, for use as a gate insulating film. A polysilicon layer 23 is chemical vapor deposited on the silicon oxide film 22 to a thickness of approx. 800~1200 Å(preferably 1000 Å). Then, an amorphous metal nitride film 24(for example, a tungsten nitride film or a molybdenum nitride film) is deposited on the polysilicon layer 23 to a thickness of approx. 600~1500 Å(preferably 1000 Å). The tungsten nitride film or the molybdenum nitride film is formed such that a nitrogen content therein is below 10%~70% of an amorphous metal and the film is amorphous. Though the tungsten nitride film or the molybdenum nitride film can be the purer as the nitrogen content is the less, the possibility of a suicide formation between the polysilicon and the metal nitride becomes the higher as the nitrogen content is the less. As shown in FIG. 2b, the semiconductor substrate 21 having the tungsten amorphous metal nitride film 24 formed thereon is heat treated at a temperature ranging 900° C.~1410° C., or at 400° C.~600° C. for the first time and at 900° C.~1410° C. for the second time. The heat treatment may be conducted in a gas ambient containing hydrogen $H_2$, nitrogen $N_2$, and argon Ar, or any one of the gases, but under a vacuum to an extent the amorphous metal nitride film 24 is not oxidized. That is, the pure tungsten(or molybdenum) or amorphous metal nitride film is susceptible to oxidation even with a very small amount of oxygen present in a chamber, an adequate vacuum is required. The reason that the first heat treatment is conducted at 400~600° C. when the amorphous metal nitride film 24 is a tungsten nitride film is for diffusing nitrogen in the tungsten nitride film to outside of the film as far as the tungsten nitride film is maintained to be amorphous, and the reason that the second heat treatment is conducted at 900° C.~1410° C. is that the tungsten nitride film has either a co-existence state of a quasistable tungsten nitride($W_2N$) 24a state and a crystalline pure tungsten film(α-W) state or a state in which all the tungsten nitride film 24 is altered into a crystalline pure tungsten film 24b, for diffusing an excessive nitrogen to outside of the film with easy. That is, the amorphous metal nitride film 24 is decomposed into tungsten(or molybdenum) and nitrogen by the heat treatment, and altered into a crystalline pure tungsten film(or pure molybdenum film) 24b starting from a surface as a heat treatment time period is elapsed. In this instance, portions of the tungsten nitride film(or molybdenum nitride film) 24a which are not decomposed yet act as diffusion barriers between the polysilicon layer 23 and the crystalline tungsten film(or molybdenum film) 24a. And, even though all the tungsten nitride film(or molybdenum nitride film) is altered into pure tungsten film(or molybdenum film) 24b, the excessive nitrogen from the tungsten nitride film(or molybdenum nitride film) is segregated between the polysilicon layer 23 and the crystalline pure tungsten film(or molybdenum film), and acts as diffusion barriers. And, a grain size of the tungsten(or molybdenum) becomes greater while the pure tungsten film(or molybdenum film) is formed by the heat treatment. As shown in FIG. 2c, the crystalline pure tungsten film(or molybdenum film), the tungsten nitride film(or molybdenum nitride film) 24a, the polysilicon layer 23, and the first oxide film 22 are subjected to anisotropic etching, to form a gate electrode 28 and a gate insulting film 22a. As shown in FIG. 2d, the gate electrode 28 is used as a mask in lightly doping surfaces of the semiconductor substrate 21, and insulating film sidewalls 29 are formed at both sides of the gate electrode 28 and the gate insulating film 22a. Then, the gate electrode 28 and the insulating film sidewalls 29 are used as a mask in heavily doping the semiconductor substrate 21, to form source/drain impurity regions 27.

FIGS. 3a~3e illustrate sections showing the steps of a method for fabricating a semiconductor device in accordance with a second preferred embodiment of the present invention.

Figure 3A:
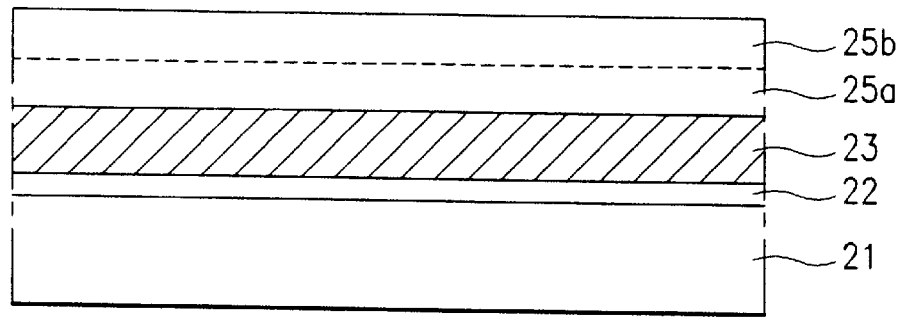
Figure 3B:
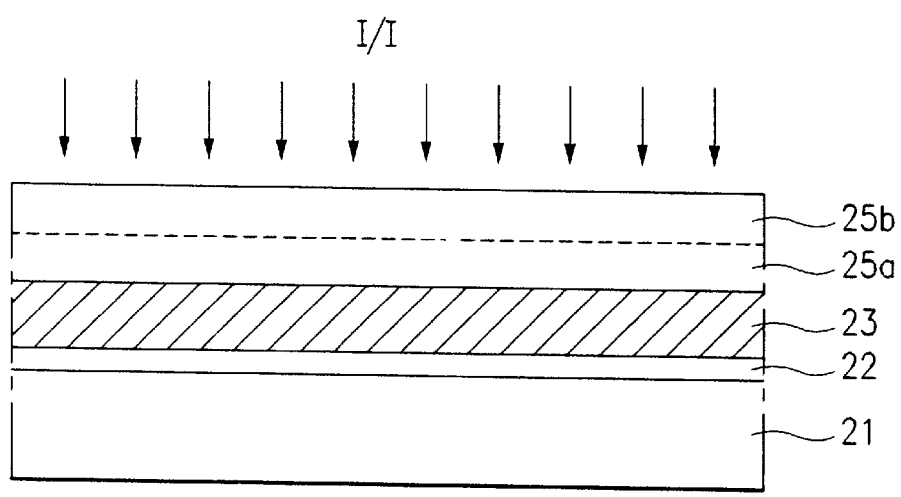
Figure 3C:
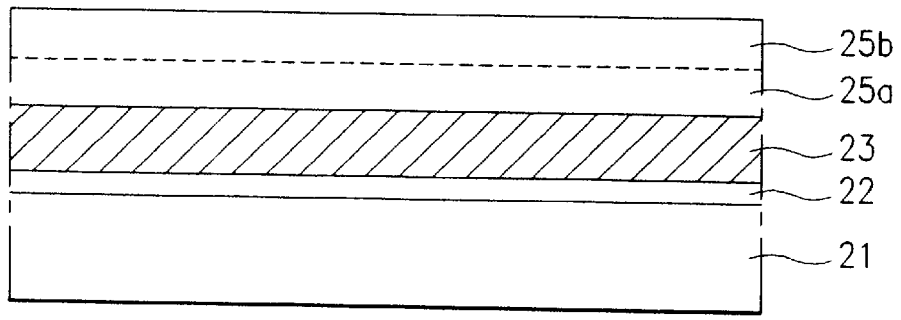
Figure 3D:
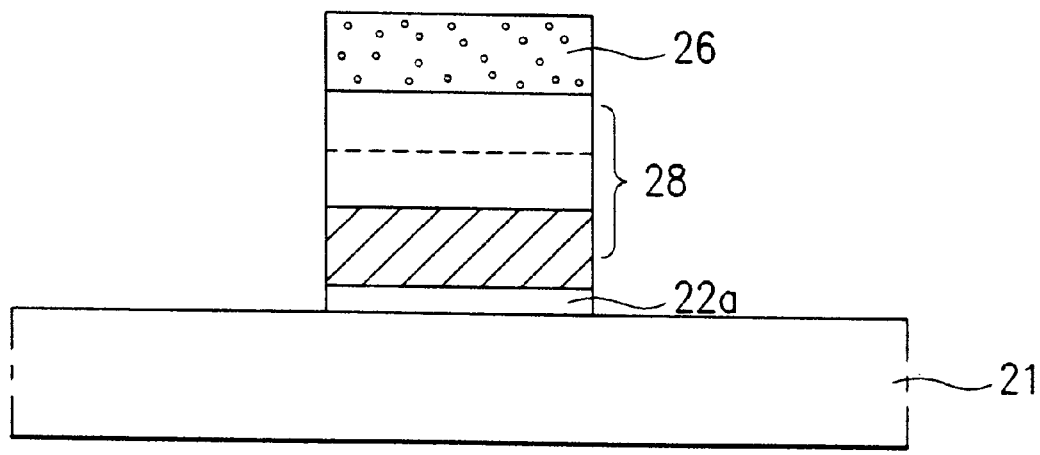
Figure 3E:
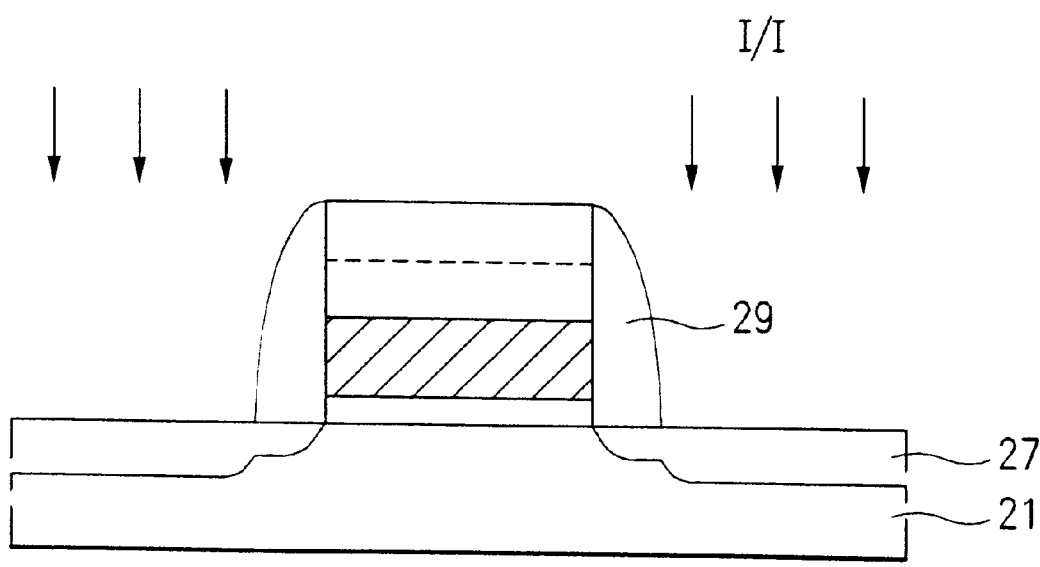

Referring to FIG. 3a, the steps of a method for fabricating a semiconductor device in accordance with a second preferred embodiment of the present invention starts with forming a silicon oxide film 22 on a semiconductor substrate 21, for use as a gate insulting film. And, a polysilicon layer 23, a first tungsten nitride film Wnx 25a, and a second tungsten nitride film 25b are deposited in succession on the silicon oxide film 22, for use as a gate electrode. In this instance, the first tungsten nitride film 25a is formed to have an amorphous lattice with approx. 20~50% of a nitrogen atom concentration, and the second tungsten nitride film 25b is to have an amorphous lattice with a nitrogen atom concentration below 20%. The second tungsten nitride film 25b is almost crystalline with the nitrogen concentration ranges 10%~20%, and β-tungsten crystalline when the nitrogen concentration is below 10%. Next, as shown in FIG. 3b, an entire surface of the second tungsten nitride film 25b is subjected to ion implantation of at least one of phosphorus (P), boron (B), and arsenic(As) ions, to break the lattice of the second tungsten nitride film 25b. That is, upon injection of impurity ions into the second tungsten nitride film 25b, the lattice of the second tungsten nitride film 25b is broken, allowing to alter the second tungsten nitride film 25b into a pure tungsten film. In the meantime, an energy of the ion implantation may be adjusted to inject impurity ions, not only to the second tungsten nitride film 25b, but also to the first tungsten nitride film 25a. Then, as shown in FIG. 3c, the amorphous second tungsten nitride film 25b is heat treated at 600~1410° C., to alter into a crystalline pure tungsten film 24b. In this instance, as the second tungsten nitride film is mostly composed of pure α-tungsten and excessive atoms, nitrogen therein is diffused to outside of the film. The α-tungsten crystalline lattice has a body-centered cubic lattice, a simple cubic lattice added with an atom at a center thereof. A grain size of the pure tungsten film becomes greater due to a latent heat discharged at alteration of the tungsten nitride film into the pure tungsten film 24b. Because the atoms ion injected into the second tungsten nitride film 25b can not make solid solution with the α-tungsten of the crystalline pure tungsten film 24b, the atoms are segregated at grain boundaries, filling vacancies and voids in the grain boundaries and increasing a density of the grain boundaries. In this instance, since the second tungsten nitride film 25b is altered into the pure tungsten film and the first tungsten nitride film 25b is altered into the pure tungsten film 24b as the heat treatment time period elapsed, the resistance of the second tungsten nitride film 25b is sharply dropped because the grain boundary density in the second tungsten nitride film is increased. As shown in FIG. 3d, a photoresist film 26 is coated on the crystalline second tungsten nitride film 25b, and subjected to patterning by exposure and development, to define a gate electrode region. Then, the patterned photoresist film 27 is used as a mask in removing the crystalline pure tungsten film 24a, the first tungsten nitride film 25a, the polysilicon layer 23, and the silicon oxide film 22 selectively, to form a gate electrode 28, and a gate insulating film 22a. As shown in FIG. 3e, the photoresist film 26 is removed, and the gate electrode 28 is used as a mask in lightly doping the semiconductor substrate 21. Insulating film sidewalls 29 are formed at sides of the gate electrode 28 and the gate insulating film 22a, and the gate electrode 28 and the insulating film sidewalls 29 are used as a mask in heavily doping the semiconductor substrate 21, to form source/drain impurity regions 27 in the semiconductor substrate 21 on both sides of the gate electrode 28. Also, in this second embodiment, a molybdenum nitride film may be formed instead of the tungsten nitride film, and heat treated, to form a pure molybdenum film.

In the aforementioned second embodiment method for fabricating a semiconductor device of the present invention, by forming a metal nitride film with a higher nitrogen content on a polysilicon layer and a metal nitride film with a lower nitrogen content thereon, and subjecting to heat treatment, heat treatment at a low temperature is made possible, with a reduction of the heat treatment time period.

As has been explained, the method for fabricating a semiconductor device of the present invention has the following advantages.

First, the large grain size obtained by altering an amorphous tungsten nitride film(or molybdenum nitride film) to a pure crystalline tungsten film(or molybdenum film) can lower a resistance of a thin film.

Second, the increased concentration of atoms at grain boundaries coming from segregation of phosphorus atoms thereto can lower resistance of a thin film.

Third, as a diffusion barrier and a crystalline pure tungsten film(or molybdenum film) can be formed on the same time by heat treating a tungsten nitride film(or molybdenum nitride film) without deposition of a pure metal film(of tungsten or molybdenum), fabrication process can be simplified and a process cost can be reduced.

Fourth, a heat treatment can be conducted within a shorter time period and at a lower temperature if two layers of tungsten nitride film(or molybdenum nitride film) of different nitrogen concentrations are formed in obtaining a pure tungsten film(or molybdenum film) by the heat treatment.

It will be apparent to those skilled in the art that various modifications and variations can be made in the method for fabricating a semiconductor device of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device comprising the steps of:
   (1) depositing an insulating film on a substrate;
   (2) depositing a silicon layer on the insulating film;
   (3) depositing an amorphous metal nitride film on the silicon layer; and,
   (4) heat treating the amorphous metal nitride film to alter into a crystalline pure metal film.

2. A method as claimed in claim 1, wherein the step (4) includes the step of heat treating the amorphous metal nitride film to alter into a state in which a crystalline pure metal film state and a metal nitride film state are coexistent.

3. A method as claimed in claim 1, wherein the amorphous metal nitride film is of either tungsten or molybdenum.

4. A method as claimed in claim 1, wherein the amorphous metal nitride film has a nitrogen concentration of 10%~70%.

5. A method as claimed in claim 1, wherein the silicon layer is chemical vapor deposited to a thickness of 800~1200 Å.

6. A method as claimed in claim 1, wherein the amorphous metal nitride film is formed to a thickness of 600~1500 Å.

7. A method as claimed in claim 1, wherein the heat treatment is conducted at 900~1410° C.

8. A method as claimed in claim 1, wherein the step (4) includes the steps of;
   a first heat treatment conducted at a temperature ranging 400~600° C. for diffusing nitrogen in the metal nitride film to outside of the metal nitride film while the metal nitride film is kept amorphous, and
   a second heat treatment conducted at a temperature ranging 900~1410° C. for diffusing nitrogen in the metal nitride film to outside of the metal nitride film while the metal nitride film is altered into a coexistence of a crystalline pure metal film in a surface portion thereof and a quasistable metal nitride film in a bottom portion thereof.

9. A method as claimed in claim 1, wherein the step (4) is conducted in a gas ambient containing hydrogen $H_2$, nitrogen $N_2$, and argon Ar, or any one of the gases under a vacuum to an extent the amorphous metal nitride film is not oxidized.

10. A method as claimed in claim 1, further comprising the step of selectively removing the silicon layer and the crystalline pure metal film, to form a gate electrode of the semiconductor device.

11. A method as claimed in claim 1, wherein the step (4) includes the step of forming a barrier layer at a boundary of the pure metal film and the silicon layer.

12. A method for fabricating a semiconductor device comprising the steps of:
   (1) forming an insulating film on a semiconductor substrate;
   (2) forming a silicon layer on the insulating film;
   (3) depositing a first amorphous metal nitride film and a second amorphous metal nitride film in succession on the silicon layer;
   (4) injecting impurity ions to break a lattice of the second metal nitride film; and,
   (5) heat treating the second metal nitride film having a lattice broken to alter into a crystalline pure metal film.

13. A method as claimed in claim 12, wherein the second metal nitride film has a nitrogen content of 20~50%.

14. A method as claimed in claim 12, wherein the second metal nitride film has a nitrogen atom concentration below 20%.

15. A method as claimed in claim 12, wherein the heat treatment in the step (5) in conducted at 600~1410° C.

16. A method as claimed in claim 12, wherein at least ions of one selected from phosphorus, boron, and arsenic are injected into the second metal nitride film as the impurities in the step (4).

17. A method as claimed in claim 12, wherein the first, and second metal nitride films are of tungsten or molybdenum.

18. A method as claimed in claim 12, wherein the second metal nitride film having a lattice broken as well as a portion of the first metal nitride film are altered into pure metal film in the step (5).

19. A method as claimed in claim 12, further comprising the step of selectively removing the silicon layer, the amorphous pure metal film, and the first metal nitride film, to form a gate electrode of the semiconductor device.

* * * * *